United States Patent
Bao et al.

(10) Patent No.: US 12,184,194 B1
(45) Date of Patent: Dec. 31, 2024

(54) AC/DC CONVERSION DEVICE FOR INTELLIGENT GREEN-POWER OPERATION AND MAINTENANCE IN POWER TRANSMISSION AND TRANSFORMATION PROJECTS

(71) Applicants: STATE GRID GANSU ELECTRIC POWER COMPANY LANZHOU POWER SUPPLY COMPANY, Gansu (CN); STATE GRID GANSU ELECTRIC POWER RESEARCH INSTITUTE, Gansu (CN)

(72) Inventors: Chengjia Bao, Gansu (CN); Long Zhao, Gansu (CN); Ru Liu, Gansu (CN); Xushan Han, Gansu (CN); Yanhong Ma, Gansu (CN); Chen Liang, Gansu (CN); Qiang Zhou, Gansu (CN); Hailong Guo, Gansu (CN); Tianyi Zhang, Gansu (CN); Wei Niu, Gansu (CN); Weicheng Shen, Gansu (CN); Hui Yuan, Gansu (CN); Wenyuan Bai, Gansu (CN); Kequan Liu, Gansu (CN); Qingzhao Hu, Gansu (CN); Ziqiang Guo, Gansu (CN); Guohan Ma, Gansu (CN); Da Chang, Gansu (CN); Bo Wu, Gansu (CN); Li Wang, Gansu (CN); Yanhua Dou, Gansu (CN); Yechang Gao, Gansu (CN); Qin Liang, Gansu (CN); Shuzhen Ren, Gansu (CN)

(73) Assignees: STATE GRID GANSU ELECTRIC POWER COMPANY LANZHOU POWER SUPPLY COMPANY, Lanzhou (CN); STATE GRID GANSU ELECTRIC POWER RESEARCH INSTITUTE, Lanzhou (CN)

( * ) Notice: Subject to any disclaimer, the term of this patent is extended or adjusted under 35 U.S.C. 154(b) by 0 days.

(21) Appl. No.: 18/610,769

(22) Filed: Mar. 20, 2024

Related U.S. Application Data

(63) Continuation of application No. PCT/CN2023/123695, filed on Oct. 10, 2023.

(30) Foreign Application Priority Data

May 10, 2023 (CN) .......................... 202310519957.6

(51) Int. Cl.
*H05K 7/20* (2006.01)
*H02M 7/00* (2006.01)
*H02M 7/04* (2006.01)

(52) U.S. Cl.
CPC ............. *H02M 7/04* (2013.01); *H02M 7/003* (2013.01); *H05K 7/20909* (2013.01); *H05K 7/20927* (2013.01); *H05K 7/20945* (2013.01)

(58) Field of Classification Search
CPC ...... H05K 5/0214; H05K 5/061; H05K 5/069; H05K 7/14325; H05K 7/20; H05K 7/20909; H05K 7/20927; H05K 7/20945
See application file for complete search history.

(56) References Cited

U.S. PATENT DOCUMENTS

| | | | | |
|---|---|---|---|---|
| 2010/0302731 A1* | 12/2010 | Belikoff | ............. | H05K 7/20945 361/722 |
| 2014/0035289 A1* | 2/2014 | Eichler | ............. | H05K 7/14325 290/55 |

(Continued)

*Primary Examiner* — Gary L Laxton
(74) *Attorney, Agent, or Firm* — SZDC Law PC

(57) ABSTRACT

The invention provides an AC/DC conversion device for intelligent green-power operation and maintenance in power transmission and transformation projects, including a cabinet, an assembling panel, an inverter, a driving mechanism and a controller. A door is mounted at the front portion of the cabinet in a fixed and sealed manner, and the assembling (Continued)

panel is fixedly mounted on the back wall of the cabinet inside the cabinet. The assembling panel, the inverter, the driving mechanism and the controller are all provided inside the cabinet, which provides desirable dust-proof effects, preventing the case where the inverter, the driving mechanism and the controller are interfered by the dust, so that this device is suitable for outdoor usage. The driving mechanism and the controller work in coordination, so that the inverter can be switched off in time when it burns out and smokes, thereby substantially reducing the risk of fire hazards.

7 Claims, 6 Drawing Sheets

(56) References Cited

U.S. PATENT DOCUMENTS

2016/0183408 A1* 6/2016 Sutherland .............. F25B 49/02
62/93
2021/0234468 A1* 7/2021 Poveda Lerma .. H05K 7/14324

\* cited by examiner

AC/DC CONVERSION DEVICE FOR INTELLIGENT GREEN-POWER OPERATION AND MAINTENANCE IN POWER TRANSMISSION AND TRANSFORMATION PROJECTS

This application is a Continuation Application of PCT/CN2023/123695, filed on Oct. 10, 2023, which claims priority to Chinese Patent Application No. 202310519957.6, filed on May 10, 2023, which is incorporated by reference for all purposes as if fully set forth herein.

FIELD OF THE INVENTION

The present invention relates to the technical field of AC/DC conversion, and in particular to an AC/DC conversion device for intelligent green-power operation and maintenance in power transmission and transformation projects.

DESCRIPTION OF THE RELATED ART

With the increasing demand for energy in countries all over the world, the excessive consumption of traditional fossil energy not only causes problems of serious air pollution and water pollution, but also brings great challenges to human survival and social and economic development. As a clean and renewable energy, solar energy has the advantages of wide distribution, rich resources, good industrialization foundation, little environmental impact and inexhaustible property compared with traditional fossil energy. Photovoltaic power generation is one of the means to utilize solar energy and is applicable to the field of intelligent green-power operation and maintenance in power transmission and transformation projects. Photovoltaic power generation generates direct current, which needs to be converted into alternating current in order to integrate the direct current into the alternating current network. A DC/AC converter, that is, an inverter, is used to convert direct current into alternating current. At present, Chinese patent Publication No. CN210839372U has disclosed a smart AC/DC conversion device including an AC/DC conversion device body, where the lower end of the AC/DC conversion device body is equipped with a fixation structure, and the outer surface of the AC/DC conversion device body is equipped with a smart heat dissipation structure.

The smart AC/DC conversion device is novel in design and reasonable in structure. The AC/DC conversion device body is fixed on the desktop through the fixation structure so as to be prevented from sliding on the desktop. The blower is arranged outside, so as to prevent the case where the blower operating inside the AC/DC conversion device body causes damage to the internal components of the AC/DC conversion device body. The operation of the blower can be controlled according to the change of temperature so as to avoid the waste of resources caused by the continuous operation of the blower. However, the above-mentioned smart AC/DC conversion device is not suitable for outdoor use due to the defect of poor dustproof effect in the actual use process. In addition, the above-mentioned smart AC/DC conversion device cannot be automatically switched off in time when it burns out and smokes, so that there is a great risk of fire hazard.

In view of this, an AC/DC conversion device for intelligent green-power operation and maintenance in power transmission and transformation projects is proposed.

SUMMARY OF THE INVENTION

The present invention provides an AC/DC conversion device for intelligent green-power operation and maintenance in power transmission and transformation projects for the purpose of solving the problems mentioned in the background.

The specific technical solution is as follows.

The invention provides an AC/DC conversion device for intelligent green-power operation and maintenance in power transmission and transformation projects applicable to the field of AC/DC conversion for intelligent green-power operation and maintenance in power transmission and transformation projects, including:
  a cabinet with a door mounted at a front portion thereof in a fixed and sealed manner;
  an assembling panel fixedly mounted on a back wall of the cabinet inside the cabinet;
  an inverter provided inside the cabinet and fixedly mounted at a front portion of the assembling panel via a connecting rod, where a DC input child terminal is electrically connected to an input of the inverter via a wire, and an AC output child terminal is electrically connected to an output of the inverter via a wire, the DC input child terminal and the AC output child terminal are both fixedly connected to the assembling panel via a connecting base, a DC input mother terminal is plugged to the DC input child terminal, a DC input cable is electrically connected to the DC input mother terminal, the end of the DC input cable away from the DC input mother terminal movably extends through a top wall of the cabinet and extends out of the cabinet, an AC output mother terminal is plugged to the AC output child terminal, an AC output cable is electrically connected to the AC output mother terminal, and the end of the AC output cable away from the AC output mother terminal movably extends through the top wall of the cabinet and extends out of the cabinet;
  a driving mechanism provided inside the cabinet for driving the DC input mother terminal to be detached from the DC input child terminal and meanwhile driving the AC output mother terminal to be detached from the AC output child terminal; and
  a controller provided inside the cabinet and fixedly mounted at the front portion of the assembling panel via a supporting rod for controlling the driving mechanism to automatically drive the DC input mother terminal to be detached from the DC input child terminal and meanwhile to drive the AC output mother terminal to be detached from the AC output child terminal when the inverter burns out and smokes.

In the AC/DC conversion device for intelligent green-power operation and maintenance in power transmission and transformation projects described above, a telescopic rubber sleeve is sleeved on both the AC output cable and the DC input cable, an inner wall of an upper end of the telescopic rubber sleeve is connected with a side surface of the AC output cable or the DC input cable in a fixed and sealed manner, and a bottom end of the telescopic rubber sleeve is connected with the top of the cabinet in a fixed and sealed manner.

In the AC/DC conversion device for intelligent green-power operation and maintenance in power transmission and transformation projects described above, the driving mechanism includes a connecting plate, an electric pushrod and two guiding members, where the connecting plate is fixedly mounted between the AC output mother terminal and the DC input mother terminal, the electric pushrod is vertically and fixedly mounted at the bottom of an inner top wall of the cabinet, the piston rod of the electric pushrod is fixedly connected with an upper central portion of the connecting plate, the two guiding members are symmetrically arranged at two sides of the electric pushrod, and the two guiding members are both mounted between the upper portion of the connecting plate and the bottom of the inner top wall of the cabinet.

In the AC/DC conversion device for intelligent green-power operation and maintenance in power transmission and transformation projects, each guiding member includes a cylindrical housing, an end cover, a guiding block, a spring and a guiding rod, where the cylindrical housing is vertically and fixedly mounted at the bottom of the inner top wall of the cabinet, the end cover is fixedly mounted inside the upper end of the cylindrical housing, the guiding block is movably mounted inside the cylindrical housing, the spring is provided inside the cylindrical housing and abuts between the guiding block and the end cover, the guiding rod is vertically and movably mounted on the bottom end wall of the cylindrical housing, the upper end of the guiding rod is fixedly connected with the bottom of the guiding block, and the bottom end of the guiding rod is fixedly connected with the upper portion of the connecting plate.

In the AC/DC conversion device for intelligent green-power operation and maintenance in power transmission and transformation projects described above, a smoke sensor is fixedly mounted at the bottom of the inner top wall of the cabinet, and the smoke sensor and the electric pushrod are both electrically connected with the controller.

The AC/DC conversion device for intelligent green-power operation and maintenance in power transmission and transformation projects described above further includes a heat-dissipation assembly for cooling down the controller and the inverter, including a coolant cartridge, a submersible pump, two L-shaped mounting plates, two swivel joints, a cylindrical aluminum alloy heat-dissipation housing and a temperature sensor, where the coolant cartridge contains coolant, the coolant cartridge is integrally provided on the bottom wall of the cabinet, a semiconductor cooler is embedded in the bottom wall of the coolant cartridge, the cooling surface of the semiconductor cooler is oriented towards the interior of the coolant cartridge, the heating surface of the semiconductor cooler is oriented towards the exterior of the coolant cartridge, the submersible pump is fixedly mounted inside the cabinet, the two L-shaped mounting plates are both fixedly mounted inside the cabinet, the two swivel joints are respectively mounted on the two L-shaped mounting plates, the two swivel joints are respectively in fluid communication with the water outlet and the water inlet of the submersible pump via the connecting pipe, the cylindrical aluminum alloy heat-dissipation housing is fixedly mounted between the two swivel joints, the two ends of the cylindrical aluminum alloy heat-dissipation housing are respectively in fluid communication with the two swivel joints, several heat-dissipation grooves are formed on an outer side wall of the cylindrical aluminum alloy heat-dissipation housing, the cylindrical aluminum alloy heat-dissipation housing is located below the controller and the inverter, the temperature sensor is fixedly mounted at the bottom of the inner top wall of the cabinet, and the temperature sensor, the semiconductor cooler and the submersible pump are all electrically connected with the controller.

In the AC/DC conversion device for intelligent green-power operation and maintenance in power transmission and transformation projects described above, the heat-dissipation assembly further includes a motor, a driving gear, a driven gear and a fan blade, where the motor is provided inside the cabinet, the motor is fixedly mounted on one of the L-shaped mounting plates, the driving gear is fixedly mounted at the end portion of the rotary shaft of the motor, the driven gear is fixedly sleeved on the cylindrical aluminum alloy heat-dissipation housing, the driven gear and the driving gear are engaged with each other, the fan blade is fixedly sleeved on the cylindrical aluminum alloy heat-dissipation housing, and the fan blade blows in a direction oriented towards the motor.

The AC/DC conversion device for intelligent green-power operation and maintenance in power transmission and transformation projects described above further includes a desiccant bag containing calcium chloride desiccant, where the desiccant bag is provided inside the cabinet and adhered to the top of the coolant cartridge via a double-sided adhesive to dehumidify the air inside the cabinet.

In the AC/DC conversion device for intelligent green-power operation and maintenance in power transmission and transformation projects described above, mounting lugs are fixedly mounted on two sides of the cabinet respectively and aligned with at the rear portion of the cabinet, and a mounting hole is provided on the mounting lug.

In the AC/DC conversion device for intelligent green-power operation and maintenance in power transmission and transformation projects described above, a transparent organic glass pane is embedded in the cabinet door, a rubber gasket is provided between the cabinet door and the cabinet, and the transparent organic glass pane serves as a window through which to observe an operation condition inside the cabinet.

The present invention has the following beneficial effects.

1. In the AC/DC conversion device for intelligent green-power operation and maintenance in power transmission and transformation projects provided by the present invention, the assembling panel, the inverter, the driving mechanism and the controller are all provided inside the cabinet, which provides desirable dust-proof effects, thus preventing the case where the inverter, the driving mechanism and the controller are interfered by the dust, which affects stability in prolonged usage thereof, so that this device is suitable for outdoor usage and in particular for usage for AC/DC conversion for intelligent green-power operation and maintenance in outdoor power transmission and transformation projects.

2. In the AC/DC conversion device for intelligent green-power operation and maintenance in power transmission and transformation projects provided by the present invention, the driving mechanism and the controller work in coordination, so that the inverter can be switched off in time when it burns out and smokes, thereby substantially reducing the risk of fire hazards.

Figure 1:
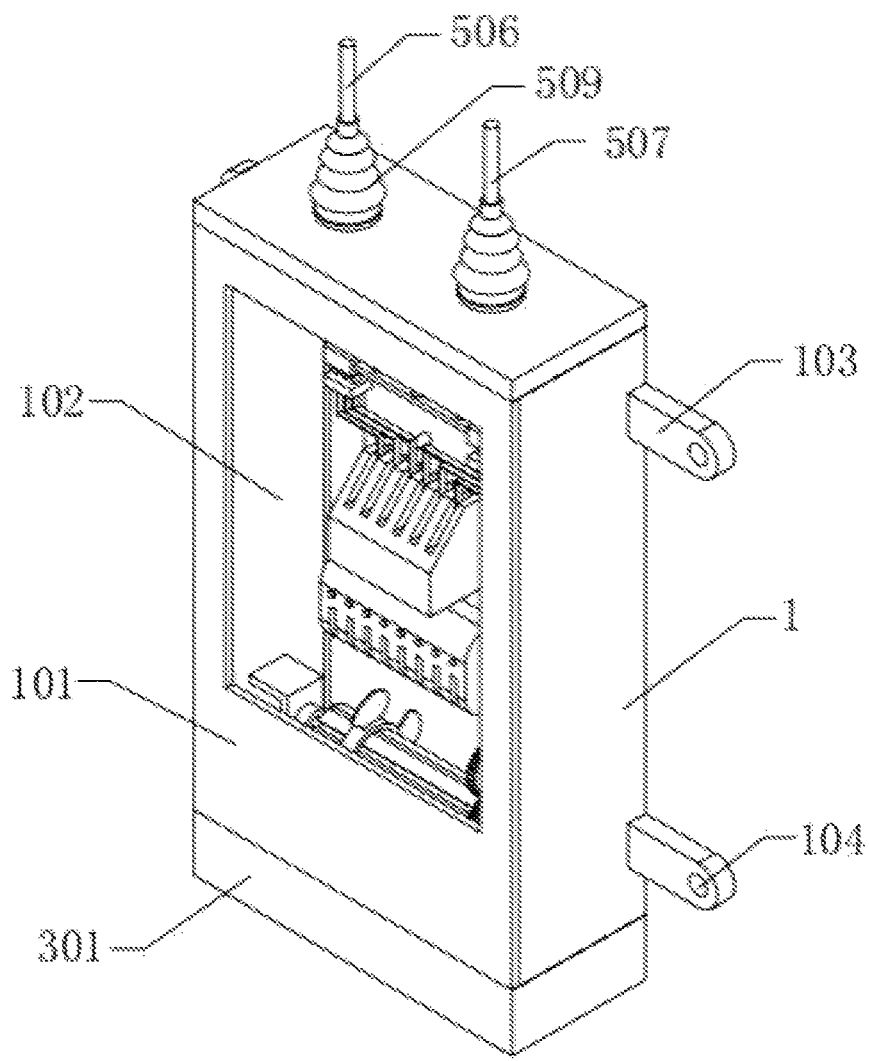
FIG. 1 is a schematic structural view of an AC/DC conversion device for intelligent green-power operation and maintenance in power transmission and transformation projects according to an embodiment of the present invention.

REFERENCE NUMERALS 1. cabinet; 101. cabinet door; 102. transparent organic glass pane; 103. mounting lug; 104. mounting hole;
2. driving mechanism; 201. connecting plate; 202. electric pushrod; 203. guiding member; 2031. cylindrical housing; 2032. guiding rod; 2033. guiding block; 2034. spring; 2035. end cover;
3. heat-dissipation assembly; 301. coolant cartridge; 302. submersible pump; 303. L-shaped mounting plate; 304. swivel joint; 305. fan blade; 306. cylindrical aluminum alloy heat-dissipation housing; 307. driving gear; 308. motor; 309. connecting pipe; 310. driven gear;
4. assembling panel;
5. inverter; 501. connecting rod; 502. DC input child terminal; 503. AC output child terminal; 504. DC input mother terminal; 505. AC output mother terminal; 506. DC input cable; 507. AC output cable; 508. connecting base; 509. telescopic rubber sleeve;
6. controller; 601. supporting rod;
7. smoke sensor;
8. temperature sensor; 9. desiccant bag.

DETAILED DESCRIPTION OF THE PREFERRED EMBODIMENTS

The technical solutions of the present invention will be further explained by specific embodiments with reference to the accompanying drawings.

The accompanying drawings are only intended for illustrative purposes, showing only schematic views, not physical pictures, and shall not be understood as limitations on this patent. In order to better illustrate the embodiments of the present invention, some components in the accompanying drawings are omitted, enlarged or reduced, and the size of the actual product is not represented. It can be understood by those skilled in the art that some well-known structures in the drawings and description thereof may be omitted.

In the accompanying drawings of embodiments of the present invention, the same or similar reference numerals correspond to the same or similar components. It should be understood that, in the description of the present invention, the oriental or positional relationship indicated by the terms "upper", "lower", "left", "right", "inner" and "outer" are based on the oriental or positional relationship shown in the accompanying drawings, and are only intended for the convenience of describing the invention and simplifying the description, and do not indicate or imply that the device or element referred to must have a specific orientation or be constructed and operated in a specific orientation, so the terms describing the positional relationship in the accompanying drawings are intended for exemplary description only and shall not be understood as limiting of this patent. For those of ordinary skill in the art, the specific meanings of the above terms can be understood according to the specific situation.

In the description of the present invention, unless otherwise specified and defined, if the term "connect" is used to indicate the connection relationship between components, this term should be understood in the broad sense, for example, it can be fixed connection, detachable connection, or integration; it can be mechanical connection or electrical connection; it can be direct connection, or indirect connected through an intermediary, or communication of the interior of two components or interaction between two components. For those of ordinary skill in the art, the specific meanings of the above terms in the present invention can be understood according to the specific situation.

The following embodiments are provided now to further explain and describe the AC/DC conversion device for intelligent green-power operation and maintenance in power transmission and transformation projects provided by the present invention.

Embodiment 1

Figure 2:
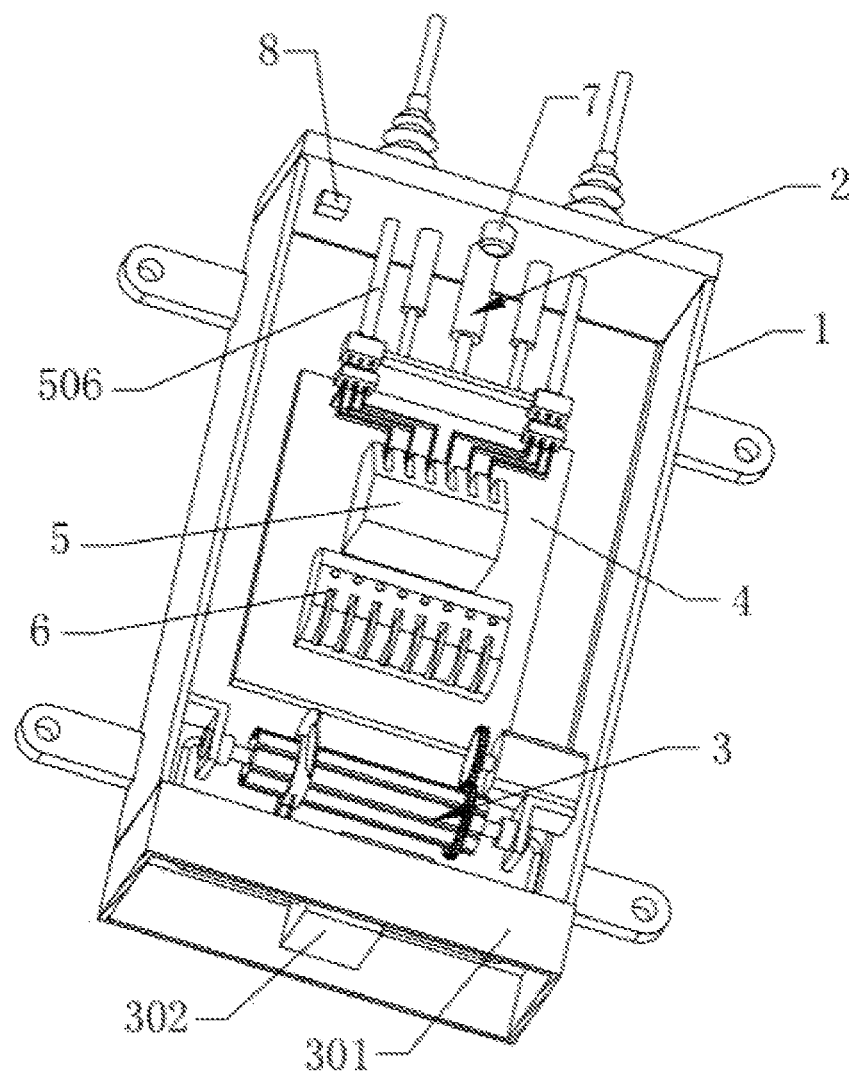
FIG. 2 is a schematic inner structural view of an AC/DC conversion device for intelligent green-power operation and maintenance in power transmission and transformation projects according to an embodiment of the present invention.
Figure 3:
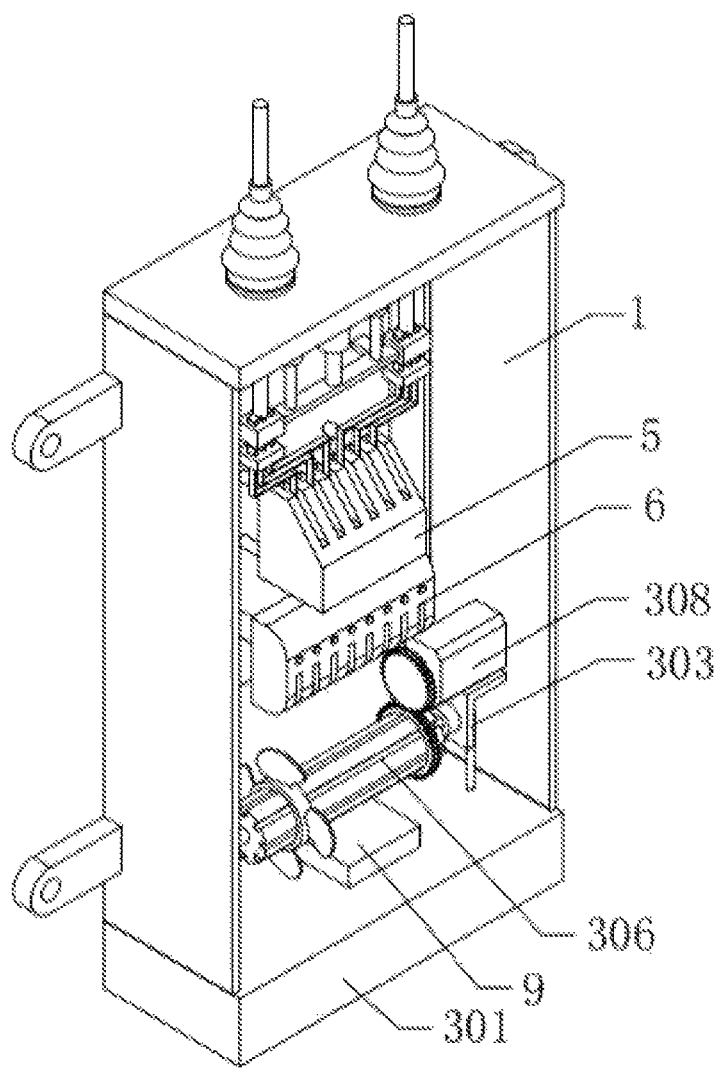
FIG. 3 is a schematic inner structural view of an AC/DC conversion device for intelligent green-power operation and maintenance in power transmission and transformation projects according to an embodiment of the present invention, viewed from another perspective.
Figure 4:
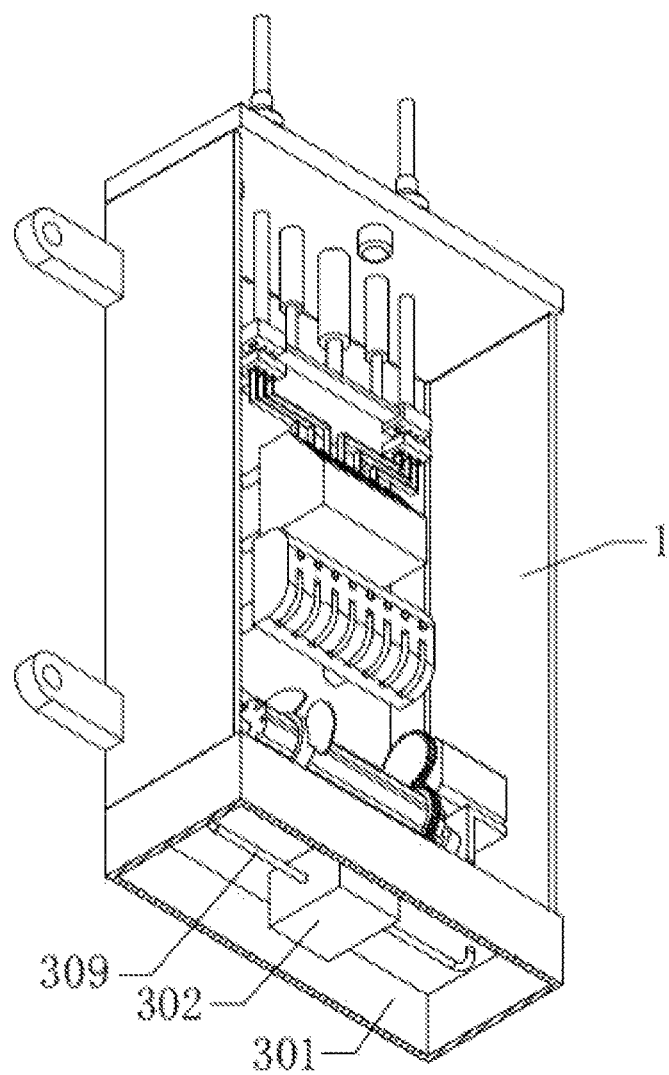
FIG. 4 is a schematic bottom sectional structural view of an AC/DC conversion device for intelligent green-power operation and maintenance in power transmission and transformation projects according to an embodiment of the present invention.
Figure 5:
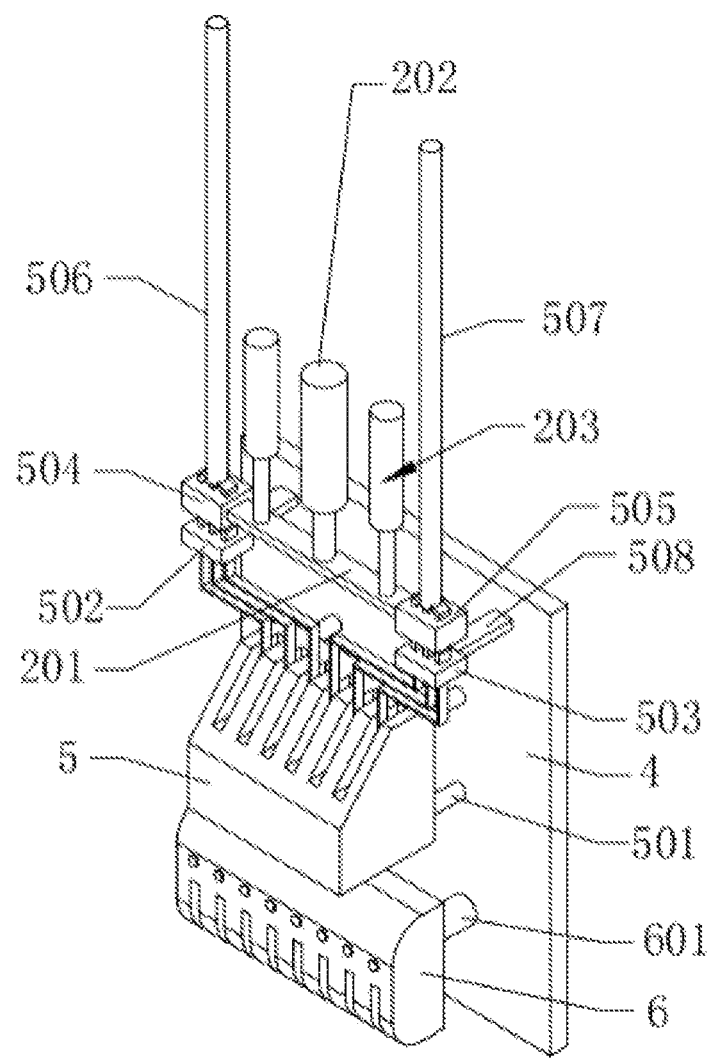
FIG. 5 is a schematic partial structural view of an AC/DC conversion device for intelligent green-power operation and maintenance in power transmission and transformation projects according to an embodiment of the present invention.
Figure 6:
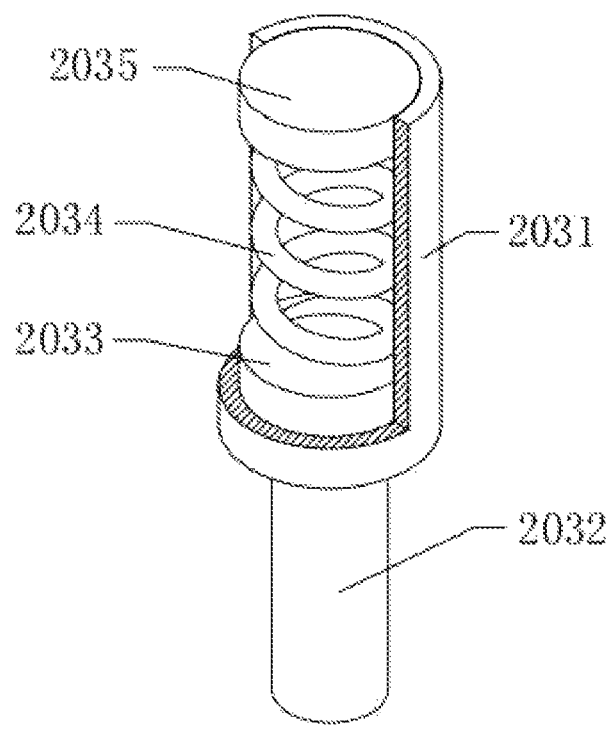
FIG. 6 is a schematic sectional structural view of a guiding member in an AC/DC conversion device for intelligent green-power operation and maintenance in power transmission and transformation projects according to an embodiment of the present invention.
Figure 7:
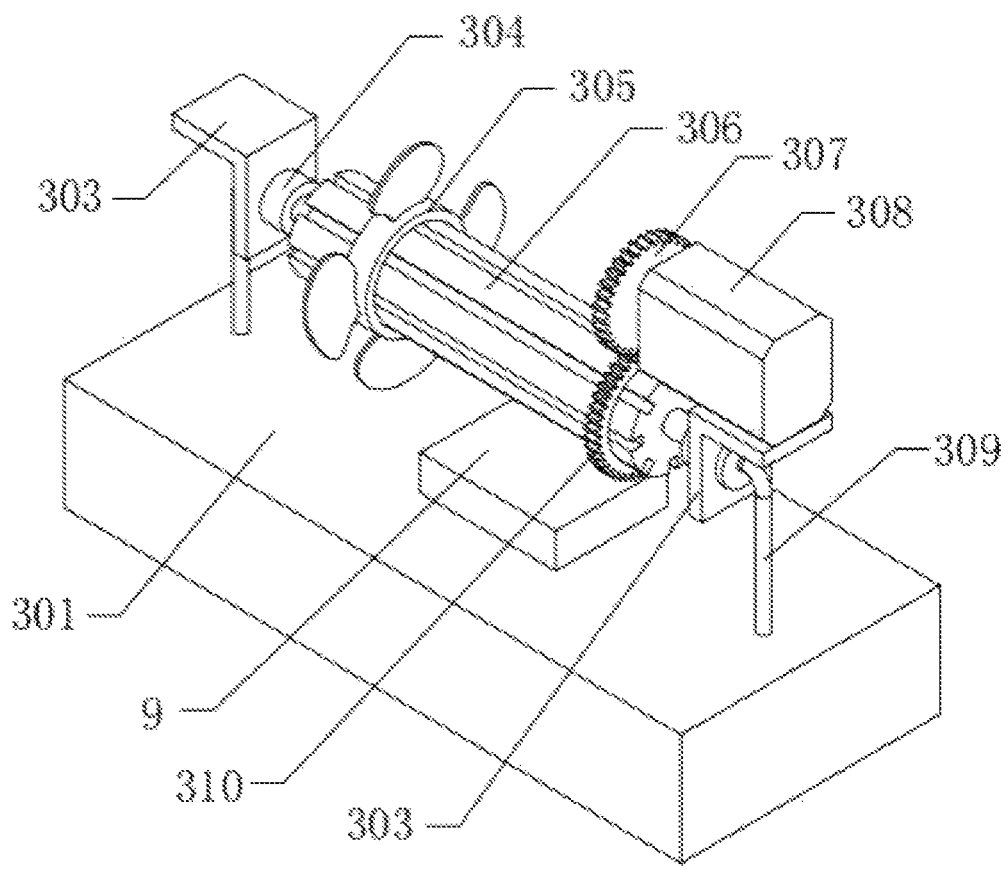
FIG. 7 is a schematic assembled structural view of a heat-dissipation assembly and a desiccant bag in an AC/DC conversion device for intelligent green-power operation and maintenance in power transmission and transformation projects according to an embodiment of the present invention.

The AC/DC conversion device for intelligent green-power operation and maintenance in power transmission and transformation projects provided by this embodiment is applied to the field of AC/DC conversion for intelligent green-power operation and maintenance in power transmission and transformation projects, and as shown in FIGS. 1-7, the AC/DC conversion device includes: a cabinet 1, an assembling panel 4, an inverter 5, a driving mechanism 2 and a controller 6.

The cabinet 1 serves as the basis for mounting of this AC/DC conversion device for intelligent green-power operation and maintenance in power transmission and transformation projects. A cabinet door 101 is mounted at the front portion of the cabinet 1 in a fixed and sealed manner. To ensure sealing between the cabinet door 101 and the cabinet 1, a rubber gasket is provided between the cabinet door 101 and the cabinet 1. To facilitate observation of the operating condition of the components inside the cabinet 1, a transparent organic glass pane 102 is embedded in the cabinet door 101. The transparent organic glass pane 102 serves as a window through which to observe the operating condition of the components inside the cabinet 1.

To facilitate mounting of the inverter 5 and the controller 6, the assembling panel 4 is fixedly mounted on the back wall of the cabinet 1 inside the cabinet 1. To prevent the case where the inverter 5 is interfered by the dust, which affects the stability of prolonged usage thereof, the inverter 5 is provided inside the cabinet 1. To ensure presence of a gap between the inverter 5 and the assembling panel 4 to facilitate air circulation and ease heat dissipation of the inverter 5, the inverter 5 is fixedly mounted at the front portion of the assembling panel 4 via the connecting rod 501. To facilitate connection with DC power output by a photovoltaic power station, a DC input child terminal 502 is electrically connected to the input of the inverter 5 via a wire and an AC output child terminal 503 is electrically connected to the output of the inverter 5 via a wire. To prevent the case where the DC input child terminal 502 and the AC output child terminal 503 are movable, which affects the usage, the DC input child terminal 502 and the AC output child terminal 503 are both fixedly connected to the assembling panel 4 via the connecting base 508. For the purpose of facilitating switch-off of the inverter 5, the DC input mother terminal 504 is plugged to the DC input child terminal 502, the DC input cable 506 is electrically connected to the DC input mother terminal 504, the end of the DC input cable 506 away from the DC input mother terminal 504 movably extends through the top wall of the cabinet 1 and extends out of the cabinet 1, the AC output mother terminal 505 is plugged to the AC output child terminal 503, the AC output cable 507 is electrically connected to the AC output mother terminal 505, and the end of the AC output cable 507 away from the AC output mother terminal 505 movably extends through the top wall of the cabinet 1 and extends out of the cabinet 1.

The driving mechanism 2 is provided inside the cabinet 1 to drive the DC input mother terminal 504 to be detached from the DC input child terminal 502 and meanwhile to drive the AC output mother terminal 505 to be detached from the AC output child terminal 503.

The controller 6 is provided inside the cabinet 1. To ensure the presence of a gap between the controller 6 and the assembling panel 4 to facilitate air circulation and ease heat dissipation of the controller 6, the controller 6 is fixedly mounted at the front portion of the assembling panel 4 via a supporting rod 601. The controller 6 serves to control the driving mechanism 2 to automatically drive the DC input mother terminal 504 to be detached from the DC input child terminal 502 and meanwhile to drive the AC output mother terminal 505 to be detached from the AC output child terminal 503 when the inverter 5 burns out and smokes. In this way, the inverter 5 can be switched off in time when the inverter 5 burns out and smokes, thereby substantially reducing the risk of fire hazards.

The controller 6 may be a PLC controller with a built-in communication module for remote communication of the AC/DC conversion device for intelligent green-power operation and maintenance in power transmission and transformation projects, so as to facilitate remote knowledge of the operation status of the AC/DC conversion device for intelligent green-power operation and maintenance in power transmission and transformation projects. The communication module includes at least one of a Lora communication module, a NB-iot communication module, a 4G communication module and a 5G communication module.

With the AC/DC conversion device for intelligent green-power operation and maintenance in power transmission and transformation projects according to the technical solution described above, the assembling panel 4, the inverter 5, the driving mechanism 2 and the controller 6 are all provided inside the cabinet 1, which provides desirable dust-proof effects, preventing the case where the inverter 5, the driving mechanism 2 and the controller 6 are interfered by the dust, affecting stability of prolonged usage thereof, so that this device is suitable for outdoor usage and in particular for usage for AC/DC conversion for intelligent green-power operation and maintenance in outdoor power transmission and transformation projects. The driving mechanism 2 and the controller 6 work in coordination, so that the inverter 5 can be switched off in time when it burns out and smokes, thereby substantially reducing the risk of fire hazards.

To further improve the dust-proof performance of the AC/DC conversion device for intelligent green-power operation and maintenance in power transmission and transformation projects, a telescopic rubber sleeve 509 is sleeved on both the AC output cable 507 and the DC input cable 506. The inner wall of the upper end of the telescopic rubber sleeve 509 is connected with the side surface of the AC output cable 507 or the DC input cable 506 in a fixed and sealed manner, and the bottom end of the telescopic rubber sleeve 509 is connected with the top of the cabinet 1 in a fixed and sealed manner. The telescopic rubber sleeve 509 can prevent dust leakage at the border between the AC output cable 507 or DC input cable 506 and the cabinet 1.

To achieve the specific function of the driving mechanism 2, the driving mechanism 2 consists essentially of a connecting plate 201, an electric pushrod 202 and two guiding members 203. The connecting plate 201 is fixedly mounted between the AC output mother terminal 505 and the DC input mother terminal 504. The electric pushrod 202 is vertically and fixedly mounted at the bottom of the inner top wall of the cabinet 1, and the piston rod of the electric pushrod 202 is fixedly connected with the upper central portion of the connecting plate 201. The two guiding members 203 are arranged on two sides of the electric pushrod 202 symmetrically. The two guiding members 203 are both mounted between the upper portion of the connecting plate 201 and the bottom of the inner top wall of the cabinet 1 to guide the electric pushrod 202 to operate stably, so as to ensure that the electric pushrod 202 drives the DC input mother terminal 504 to be detached from the DC input child terminal 502 and drives the AC output mother terminal 505 to be detached from the AC output child terminal 503, drives the DC input mother terminal 504 to be accurately plugged to the DC input child terminal 502 and drives the AC output mother terminal 505 to be accurately plugged to the AC output child terminal 503 again, so that the inverter 5 is put in use again.

Each guiding member 203 consists of a cylindrical housing 2031, an end cover 2035, a guiding block 2033, a spring 2034 and a guiding rod 2032. The cylindrical housing 2031 is vertically and fixedly mounted at the bottom of the inner top wall of the cabinet 1. The end cover 2035 is fixedly mounted inside the upper end of the cylindrical housing 2031. The guiding block 2033 is movably mounted inside the cylindrical housing 2031. The spring 2034 is provided inside the cylindrical housing 2031 and abutted between the guiding block 2033 and the end cover 2035. The guiding rod 2032 is vertically and movably mounted on the bottom end wall of the cylindrical housing 2031. The upper end of the guiding rod 2032 is fixedly connected with the bottom of the guiding block 2033. The bottom end of the guiding rod 2032 is fixedly connected with the upper portion of the connecting plate 201. The guiding member 203, in coordination with the cylindrical housing 2031, the end cover 2035, the guiding block 2033, the spring 2034 and the guiding rod 2032, has stable structural performance, and provides guidance for the electric pushrod 202 while applying an acting force on the connecting plate 201, the acting force can drive the connecting plate 201 to bring along the DC input mother terminal 504 to be stably connected with the DC input child terminal 502 and bring along the AC output mother terminal 505 to be stably connected with the AC output child terminal 503, thereby improving the stability of the AC/DC conversion device for intelligent green-power operation and maintenance in power transmission and transformation projects.

For automatic switch-off of the inverter 5 when it burns out and smokes, a smoke sensor 7 is fixedly mounted at the bottom of the inner top wall of the cabinet 1. The smoke sensor 7 and electric pushrod 202 are both electrically connected with the controller 6. When the smoke sensor 7 senses that the inverter 5 burns out and smokes, it generates an electric signal and uploads the electric signal to the controller 6. The controller 6 controls the electric pushrod 202 to drive the connecting plate 201 to bring along the DC input mother terminal 504 to be detached from the DC input child terminal 502 and bring along the AC output mother terminal 505 to be detached from the AC output child terminal 503, thereby achieving the purpose of automatically switching off the inverter 5 when it burns out and smokes.

The operation principle of the driving mechanism 2 is as follows.

The initial status of the driving mechanism 2 is as follows. The piston rod of the electric pushrod 202 is retracted, whereupon the DC input mother terminal 504 is detached from the input child terminal 502, while the AC output mother terminal 505 is detached from the AC output child terminal 503, whereupon the inverter 5 is not put in use.

The operation status of the driving mechanism 2 is as follows. The piston rod of the electric pushrod 202 is extended, whereupon the piston rod of the electric pushrod 202 pushes the connecting plate 201 to bring along the DC input mother terminal 504 to be plugged to the DC input child terminal 502, and meanwhile to bring along the AC output mother terminal 505 to be plugged to the AC output child terminal 503, whereupon the inverter 5 is put in use.

The protection status of the driving mechanism 2 is as follows. When the smoke sensor 7 senses that the inverter 5 burns out and smokes, it generates an electric signal and uploads the electric signal to the controller 6. The controller 6 controls the piston rod of the electric pushrod 202 to be retracted over the maximum stroke to drive the connecting plate 201 to bring along the DC input mother terminal 504 to be detached from the DC input child terminal 502, and meanwhile to bring along the AC output mother terminal 505 to be detached from the AC output child terminal 503, thereby achieving the purpose of automatically switching off the inverter 5 when it burns out and smokes.

The reset status of the driving mechanism 2 is as follows: After the fault of the inverter 5 is eliminated, the controller 6 controls the piston rod of the electric pushrod 202 to be extended over the maximum stroke to drive the connecting plate 201 to bring along the DC input mother terminal 504 to be plugged to the DC input child terminal 502, and meanwhile to bring along the AC output mother terminal 505 to be plugged to the AC output child terminal 503, whereupon the inverter 5 is automatically put in use again, so that the capability of green-power operation and maintenance in power transmission and transformation projects is substantially enhanced.

Embodiment 2

The difference between the AC/DC conversion device for intelligent green-power operation and maintenance in power transmission and transformation projects provided by this embodiment and that provided by the embodiment 1 is as follows.

For heat dissipation and cooldown of the controller 6 and the inverter 5, a heat-dissipation assembly 3 is further provided to cool down the controller 6 and the inverter 5. The heat-dissipation assembly 3 essentially consists of a coolant cartridge 301, a submersible pump 302, two L-shaped mounting plates 303, two swivel joints 304, a cylindrical aluminum alloy heat-dissipation housing 306 and a temperature sensor 8. A coolant of the type of glycol and the like is contained inside the coolant cartridge 301, and the coolant cartridge 301 is integrally provided on the bottom wall of the cabinet 1. The coolant cartridge 301 is made of the aluminum alloy material, so that the coolant cartridge 301 has desirable heat dissipation performance. To facilitate cooldown of the coolant inside the coolant cartridge 301, a semiconductor cooler is embedded on the bottom wall of the coolant cartridge 301. The cooling face of the semiconductor cooler is orientated towards the interior of the coolant cartridge 301 and the heating surface of the semiconductor cooler is oriented towards the exterior of the coolant cartridge 301. The semiconductor cooler is used to cool down the coolant inside the coolant cartridge 301. The submersible pump 302 is fixedly mounted inside the cabinet 1. The two L-shaped mounting plates 303 are both fixedly mounted inside the cabinet 1. The two swivel joints 304 are respectively mounted on the two L-shaped mounting plates 303. The two swivel joints 304 are in fluid communication with the water outlet and the water inlet of the submersible pump 302 respectively via the connecting pipe 309. The cylindrical aluminum alloy heat-dissipation housing 306 is fixedly mounted between the two swivel joints 304, and the two ends of the cylindrical aluminum alloy heat-dissipation housing 306 are in fluid communication with the two swivel joints 304 respectively. The cylindrical aluminum alloy heat-dissipation housing 306 has the function of rotation. To improve the heat dissipation effect of the cylindrical aluminum alloy heat-dissipation housing 306, several heat-dissipation grooves are opened on the outer side wall of the cylindrical aluminum alloy heat-dissipation housing 306. To improve the heat dissipation effect of the cylindrical aluminum alloy heat-dissipation housing 306 on the controller 6 and the inverter 5, the cylindrical aluminum alloy heat-dissipation housing 306 is provided below the controller 6 and the inverter 5. The temperature sensor 8 is fixedly mounted at the bottom of the inner top wall of the cabinet 1 and the temperature sensor 8, the semiconductor cooler and the submersible pump 302 are all electrically connected with the controller 6. The temperature sensor 8 is used to detect the temperature inside the cabinet 1 in real time. When the temperature inside the cabinet 1 is greater than a set value, the controller 6 controls the submersible pump 302 and the semiconductor cooler to start operation according to the temperature data uploaded by the temperature sensor 8. The semiconductor cooler is used to cool down the coolant inside the coolant cartridge 301. The submersible pump 302 is used to pump the coolant inside the coolant cartridge 301 into the cylindrical aluminum alloy heat-dissipation housing 306, and the heat inside the cabinet 1 is exchanged out by means of circulation, so as to cool down the controller 6 and the inverter 5, which facilitates prolonged stable operation of the AC/DC conversion device for intelligent green-power operation and maintenance in power transmission and transformation projects.

To further improve the heat dissipation performance of the heat-dissipation assembly 3, the heat-dissipation assembly 3 further includes a motor 308, a driving gear 307, a driven gear 310 and a fan blade 305. The motor 308 is provided inside the cabinet 1 and the motor 308 is fixedly mounted on one of the L-shaped mounting plates 303. The driving gear 307 is fixedly mounted on the end portion of the rotary shaft of the motor 308, the driven gear 310 is fixedly sleeved on the cylindrical aluminum alloy heat-dissipation housing 306, and the driven gear 310 and the driving gear 307 are engaged with each other. The fan blade 305 is fixedly sleeved on the cylindrical aluminum alloy heat-dissipation housing 306. The fan blade 305 blows in a direction oriented towards the motor 308. The motor 308 is used to drive the cylindrical aluminum alloy heat-dissipation housing 306 to rotate. The cylindrical aluminum alloy heat-dissipation housing 306 brings along the fan blade 305 to blow towards the motor 308, so as to force the air inside the cabinet 1 to flow during heat dissipation for the motor 308, thereby further improving the heat dissipation performance of the heat-dissipation assembly 3 and providing superior cooldown effects inside the cabinet 1.

The operation principle of the heat-dissipation assembly 3 is as follows. When the temperature sensor 8 detects that the temperature inside the cabinet 1 is greater than a set value, the controller 6 controls the submersible pump 302, the motor 308 and the semiconductor cooler to start operation. The semiconductor cooler operates to cool down the coolant inside the coolant cartridge 301. The submersible pump 302 pumps the coolant inside the coolant cartridge 301 into the cylindrical aluminum alloy heat-dissipation housing 306. The motor 308 drives the cylindrical aluminum alloy heat-dissipation housing 306 to rotate. The cylindrical aluminum alloy heat-dissipation housing 306 brings along the fan blade 305 to blow towards the motor 308, so as to force the air inside the cabinet 1 to flow during heat dissipation for the motor 308, thereby improving the heat dissipation effect. The heat inside the cabinet 1 is exchanged out by means of circulation of the coolant, achieving cooldown of the controller 6 and the inverter 5 while preventing the dust from entering the cabinet 1, so that the AC/DC conversion device for intelligent green-power operation and maintenance in power transmission and transformation projects is capable of prolonged stable operation.

Embodiment 3

The difference between the AC/DC conversion device for intelligent green-power operation and maintenance in power transmission and transformation projects provided by this embodiment and that provide by the embodiment 2 is as follows. To prevent damping inside the cabinet 1, a desiccant bag 9 containing calcium chloride desiccant is further provided. The desiccant bag 9 is provided inside the cabinet 1. To prevent the desiccant bag 9 from moving and affecting operation of other components in the cabinet 1, the desiccant bag 9 is adhered to the top of the coolant cartridge 301 with a double-sided adhesive, so as to dehumidify the air inside the cabinet 1 and prevent the case where humid air affects the operation performance of the components inside the cabinet 1, so that the AC/DC conversion device for intelligent green-power operation and maintenance in power transmission and transformation projects can operate stably.

In order to facilitate mounting of the AC/DC conversion device for intelligent green-power operation and maintenance in power transmission and transformation projects, mounting lugs 103 are fixedly mounted on two sides of the cabinet 1 respectively and aligned with each other at the rear portion of the cabinet, and a mounting hole 104 is provided on the mounting lug 103.

In summary, the AC/DC conversion device for intelligent green-power operation and maintenance in power transmission and transformation projects provided by this embodiment has the following advantages.

In this AC/DC conversion device for intelligent green-power operation and maintenance in power transmission and transformation projects, the assembling panel 4, the inverter 5, the driving mechanism 2 and the controller 6 are all provided inside the cabinet 1, which provides desirable dust-proof effects, preventing the case where the inverter 5, the driving mechanism 2 and the controller 6 are interfered by the dust, which affects stability in prolonged usage thereof, so that this device is suitable for outdoor usage and in particular for usage for AC/DC conversion for intelligent green-power operation and maintenance in outdoor power transmission and transformation projects.

The driving mechanism 2 and the controller 6 work in coordination, so that the inverter 5 can be switched off in time when it burns out and smokes, thereby substantially reducing the risk of fire hazards.

The heat-dissipation assembly 3 is used for heat dissipation and cooldown of the controller 6 and the inverter 5, and most importantly, the heat-dissipation assembly 3 will not affect the dust-proof performance of the AC/DC conversion device for intelligent green-power operation and maintenance in power transmission and transformation projects, so that the AC/DC conversion device for intelligent green-power operation and maintenance in power transmission and transformation projects is capable of prolonged stable operation.

During usage, a bolt or expansion bolt cooperates with the mounting lug 103 to mount the AC/DC conversion device for intelligent green-power operation and maintenance in power transmission and transformation projects on an upright post or a wall, then the end of the DC input cable 506 away from the DC input mother terminal 504 is connected to the output of the photovoltaic power station, and the end of the AC output cable 507 away from the AC output mother terminal 505 is connected to the AC network. Then the controller 6 controls the electric pushrod 202 drives the DC input mother terminal 504 to be accurately plugged to the DC input child terminal 502 and drives the AC output mother terminal 505 to be accurately plugged to the AC output child terminal 503, so that the inverter 5 is put in use.

When the smoke sensor 7 senses the burnout and smoking of the inverter 5, it generates an electric signal and uploads the electric signal to the controller 6. The controller 6 controls the electric pushrod 202 to drive the connecting plate 201 to bring along the DC input mother terminal 504 to be detached from the DC input child terminal 502 and the AC output mother terminal 505 to be detached from the AC output child terminal 503, thereby achieving the purpose of automatically switching off the inverter 5 when it burns out and smokes.

When the temperature sensor 8 detects that the temperature inside the cabinet 1 is greater than a set value, the controller 6 controls the submersible pump 302, the motor 308 and the semiconductor cooler to start operation. The semiconductor cooler operates to cool down the coolant inside the coolant cartridge 301. The submersible pump 302 pumps the coolant inside the coolant cartridge 301 into the cylindrical aluminum alloy heat-dissipation housing 306. The motor 308 drives the cylindrical aluminum alloy heat-dissipation housing 306 to rotate. The cylindrical aluminum alloy heat-dissipation housing 306 brings along the fan blade 305 to blow towards the motor 308, so as to force the air inside the cabinet 1 to flow during heat dissipation of the motor 308. Through circulation of the coolant, heat inside the cabinet 1 is exchanged out, so as to achieve the purpose of cooling down the controller 6 and the inverter 5, so that the AC/DC conversion device for intelligent green-power operation and maintenance in power transmission and transformation projects is capable of prolonged stable operation.

Described above are only the preferred embodiments of the present invention, which do not limit the implementation and protection scope of the present invention. Those skilled in the art should be able to realize that all equivalent substitutions and obvious changes made by using the description and drawings of the present invention should be included in the protection scope of the present invention.

What is claimed is:

1. An AC/DC conversion device for intelligent green-power operation and maintenance in power transmission and transformation projects, comprising:

a cabinet (1) with a door (101) mounted at a front portion thereof in a fixed and sealed manner;

an assembling panel (4) fixedly mounted on a back wall of the cabinet (1) inside the cabinet;

an inverter (5) provided inside the cabinet (1) and fixedly mounted at a front portion of the assembling panel (4) via a connecting rod (501), where a DC input child terminal (502) is electrically connected to an input of the inverter (5) via a wire, and an AC output child terminal (503) is electrically connected to an output of the inverter (5) via a wire, the DC input child terminal (502) and the AC output child terminal (503) are both fixedly connected to the assembling panel (4) via a connecting base (508), a DC input mother terminal (504) is plugged to the DC input child terminal (502), a DC input cable (506) is electrically connected to the DC input mother terminal (504), an end of the DC input cable (506) away from the DC input mother terminal (504) movably extends through a top wall of the cabinet (1) and extends out of the cabinet (1), an AC output mother terminal (505) is plugged to the AC output child terminal (503), an AC output cable (507) is electrically connected to the AC output mother terminal (505), and an end of the AC output cable (507) away from the AC output mother terminal (505) movably extends through the top wall of the cabinet (1) and extends out of the cabinet (1);

a driving mechanism (2) provided inside the cabinet (1), the driving mechanism (2) comprising a connecting plate (201), an electric pushrod (202) and two guiding members (203), where the connecting plate (201) is fixedly mounted between the AC output mother terminal (505) and the DC input mother terminal (504), the electric pushrod (202) is vertically and fixedly mounted at the bottom of an inner top wall of the cabinet (1), a piston rod of the electric pushrod (202) is fixedly connected with an upper central portion of the connecting plate (201), the two guiding members (203) are symmetrically arranged at two sides of the electric pushrod (202), and the two guiding members (203) are both mounted between the upper portion of the connecting plate (201) and the bottom of the inner top wall of the cabinet (1);

each guiding member (203) comprising a cylindrical housing (2031), an end cover (2035), a guiding block (2033), a spring (2034) and a guiding rod (2032), where the cylindrical housing (2031) is vertically and fixedly mounted at the bottom of the inner top wall of the cabinet (1), the end cover (2035) is fixedly mounted inside an upper end of the cylindrical housing (2031), the guiding block (2033) is movably mounted inside the cylindrical housing (2031), the spring (2034) is provided inside the cylindrical housing (2031) and abuts between the guiding block (2033) and the end cover (2035), the guiding rod (2032) is vertically and movably mounted on the bottom end wall of the cylindrical housing (2031), an upper end of the guiding rod (2032) is fixedly connected with the bottom of the guiding block (2033), and a bottom end of the guiding rod (2032) is fixedly connected with an upper portion of the connecting plate (201); and a controller (6) provided inside the cabinet (1) and fixedly mounted at a front portion of the assembling panel (4) via a supporting rod (601) for controlling the driving mechanism (2) to automatically drive the DC input mother terminal (504) to be detached from the DC input child terminal (502) and also drive the AC output mother terminal (505) to be detached from the AC output child terminal (503) when the inverter (5) burns out and smokes;

a smoke sensor (7) is fixedly mounted at the bottom of the inner top wall of the cabinet (1), and the smoke sensor (7) and the electric pushrod (202) are both electrically connected with the controller (6).

2. The AC/DC conversion device for intelligent green-power operation and maintenance in power transmission and transformation projects of claim 1, wherein a telescopic rubber sleeve (509) is sleeved on both the AC output cable (507) and the DC input cable (506), an inner wall of an upper end of the telescopic rubber sleeve (509) is connected with a side surface of the AC output cable (507) or the DC input cable (506) in a fixed and sealed manner, and a bottom end of the telescopic rubber sleeve (509) is connected with a top of the cabinet (1) in a fixed and sealed manner.

3. The AC/DC conversion device for intelligent green-power operation and maintenance in power transmission and transformation projects of claim 1, further comprising a heat-dissipation assembly (3) for cooling down the controller (6) and the inverter (5), the heat-dissipation assembly (3) comprising a coolant cartridge (301), a submersible pump (302), two L-shaped mounting plates (303), two swivel joints (304), a cylindrical aluminum alloy heat-dissipation housing (306) and a temperature sensor (8), where the coolant cartridge (301) contains coolant, the coolant cartridge (301) is integrally provided on a bottom wall of the cabinet (1), a semiconductor cooler is embedded in a bottom wall of the coolant cartridge (301), a cooling surface of the semiconductor cooler is oriented towards an interior of the coolant cartridge (301), a heating surface of the semiconductor cooler is oriented towards an exterior of the coolant cartridge (301), the submersible pump (302) is fixedly mounted inside the cabinet (1), the two L-shaped mounting plates (303) are both fixedly mounted inside the cabinet (1), the two swivel joints (304) are respectively mounted on the two L-shaped mounting plates (303), the two swivel joints (304) are respectively in fluid communication with a water outlet and a water inlet of the submersible pump (302) via a connecting pipe (309), the cylindrical aluminum alloy heat-dissipation housing (306) is fixedly mounted between the two swivel joints (304), two ends of the cylindrical aluminum alloy heat-dissipation housing (306) are respectively in fluid communication with the two swivel joints (304), several heat-dissipation grooves are formed on an outer side wall of the cylindrical aluminum alloy heat-dissipation housing (306), the cylindrical aluminum alloy heat-dissipation housing (306) is located below the controller (6) and the inverter (5), the temperature sensor (8) is fixedly mounted at the bottom of an inner top wall of the cabinet (1), and the temperature sensor (8), the semiconductor cooler and the submersible pump (302) are all electrically connected with the controller (6).

4. The AC/DC conversion device for intelligent green-power operation and maintenance in power transmission and transformation projects of claim 3, wherein the heat-dissipation assembly (3) further comprises a motor (308), a driving gear (307), a driven gear (310) and a fan blade (305), where the motor (308) is provided inside the cabinet (1), the motor (308) is fixedly mounted on one of the L-shaped mounting plates (303), the driving gear (307) is fixedly mounted at an end portion of a rotary shaft of the motor (308), the driven gear (310) is fixedly sleeved on the cylindrical aluminum alloy heat-dissipation housing (306), the driven gear (310) and the driving gear (307) are engaged with each other, the fan blade (305) is fixedly sleeved on the cylindrical aluminum alloy heat-dissipation housing (306), and the fan blade (305) blows in a direction oriented towards the motor (308).

5. The AC/DC conversion device for intelligent green-power operation and maintenance in power transmission and transformation projects of claim 4, further comprising a desiccant bag (9) containing calcium chloride desiccant, where the desiccant bag (9) is provided inside the cabinet (1) and adhered to a top of the coolant cartridge (301) via a double-sided adhesive to dehumidify the air inside the cabinet (1).

6. The AC/DC conversion device for intelligent green-power operation and maintenance in power transmission and transformation projects of claim 1, wherein mounting lugs (103) are fixedly mounted on two sides of the cabinet (1) respectively and aligned with each other at a rear portion of the cabinet, and a mounting hole (104) is provided on the mounting lug (103).

7. The AC/DC conversion device for intelligent green-power operation and maintenance in power transmission and transformation projects of claim 1, wherein a transparent organic glass pane (102) is embedded in the cabinet door (101), a rubber gasket is provided between the cabinet door (101) and the cabinet (1), and the transparent organic glass pane (102) serves as a window through which to observe an operation condition inside the cabinet (1).

* * * * *